(12) United States Patent
Tao et al.

(10) Patent No.: US 11,494,254 B2
(45) Date of Patent: Nov. 8, 2022

(54) STORAGE SYSTEM WITH PREDICTIVE ADJUSTMENT MECHANISM AND METHOD OF OPERATION THEREOF

(71) Applicant: CNEX LABS, Inc., San Jose, CA (US)

(72) Inventors: Jun Tao, Ladera Ranch, CA (US); Chih-Chieng Cheng, Cupertino, CA (US); Shanying Luo, Fremont, CA (US)

(73) Assignee: CNEX LABS, Inc., San Jose, CA (US)

( * ) Notice: Subject to any disclaimer, the term of this patent is extended or adjusted under 35 U.S.C. 154(b) by 227 days.

(21) Appl. No.: 16/723,070

(22) Filed: Dec. 20, 2019

(65) Prior Publication Data

US 2021/0191804 A1   Jun. 24, 2021

(51) Int. Cl.
    *G06F 11/00*     (2006.01)
    *G06F 11/07*     (2006.01)
    *G11C 16/26*     (2006.01)
    *G11C 16/34*     (2006.01)

(52) U.S. Cl.
    CPC ...... *G06F 11/0793* (2013.01); *G06F 11/0727* (2013.01); *G06F 11/0751* (2013.01); *G11C 16/26* (2013.01); *G11C 16/3418* (2013.01)

(58) Field of Classification Search
    CPC ............. G06F 11/0727; G06F 11/0751; G06F 11/0793; G11C 16/26; G11C 16/3418
    See application file for complete search history.

(56) References Cited

U.S. PATENT DOCUMENTS

| 6,621,742 | B1 | 9/2003 | Yamada |
| 9,142,312 | B1 | 9/2015 | Yang et al. |
| 9,251,909 | B1 | 2/2016 | Camp et al. |
| 9,293,203 | B2 | 3/2016 | Yang |
| 2012/0221917 | A1* | 8/2012 | Bueb ............ G06F 11/1012 714/755 |
| 2013/0106803 | A1 | 5/2013 | Tan |
| 2013/0132652 | A1* | 5/2013 | Wood ............ G06F 3/0629 711/103 |
| 2013/0166949 | A1* | 6/2013 | Um ............ G06F 11/0793 714/15 |
| 2013/0185612 | A1* | 7/2013 | Lee ............ G11C 29/52 714/773 |
| 2014/0129872 | A1* | 5/2014 | Bueb ............ G06F 11/1012 714/2 |
| 2014/0146615 | A1 | 5/2014 | Yang |
| 2014/0281770 | A1* | 9/2014 | Kim ............ G11C 29/50 714/721 |
| 2016/0041891 | A1* | 2/2016 | Malshe ............ G06F 11/1048 714/704 |
| 2016/0147582 | A1* | 5/2016 | Karakulak ............ G06F 11/073 714/37 |

(Continued)

*Primary Examiner* — Joshua P Lottich
(74) *Attorney, Agent, or Firm* — Perspectives Law Group, Corp.

(57) ABSTRACT

A storage system includes: a control processor, configured to: read user data with a read threshold, determine which threshold adjustment range has been activated by reading a 1 and 0 counter, select an adjusted read threshold, based on the threshold adjustment range, to reread the user data in a physical block using the adjusted read threshold to correct the user data; and reading the user data in the physical block using the adjusted read threshold selected from the threshold adjustment range.

17 Claims, 6 Drawing Sheets

(56) References Cited

U.S. PATENT DOCUMENTS

| | | | |
|---|---|---|---|
| 2016/0357472 A1* | 12/2016 | Choi | G06F 11/1048 |
| 2017/0125111 A1* | 5/2017 | Sankaranarayanan | G11C 16/26 |
| 2018/0011753 A1* | 1/2018 | Alhussien | G06F 11/0775 |
| 2018/0012663 A1* | 1/2018 | Alhussien | H03M 13/6325 |
| 2018/0046527 A1* | 2/2018 | Reusswig | G06F 11/004 |
| 2019/0096485 A1* | 3/2019 | Jung | G11C 16/0483 |
| 2020/0201726 A1* | 6/2020 | Lee | G11C 29/52 |
| 2020/0303016 A1* | 9/2020 | Amada | G06F 3/0659 |
| 2020/0310926 A1* | 10/2020 | Lee | G06F 11/3013 |
| 2020/0364103 A1* | 11/2020 | Sharifi Tehrani | G06F 11/1048 |
| 2021/0019208 A1* | 1/2021 | Sheperek | G11C 16/10 |
| 2021/0064249 A1* | 3/2021 | Mehta | G06F 3/0634 |

\* cited by examiner

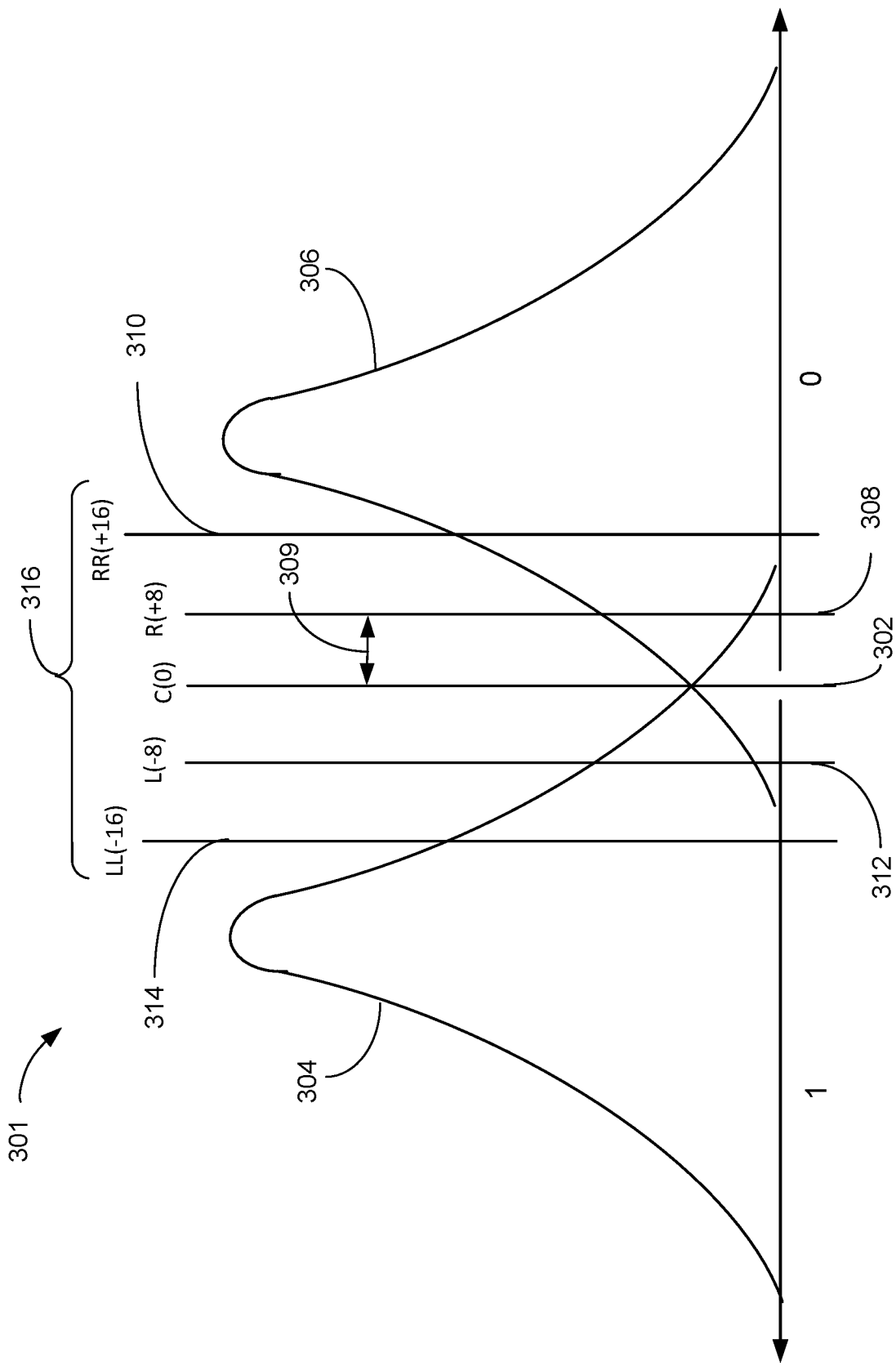

STORAGE SYSTEM WITH PREDICTIVE ADJUSTMENT MECHANISM AND METHOD OF OPERATION THEREOF

TECHNICAL FIELD

An embodiment of the present invention relates generally to a storage system, and more particularly to a system for predictive adjustment of threshold voltages.

BACKGROUND

Non-volatile memory, such as NAND flash, has driven massive increases in capacity and verification processes to support intelligent devices. In order to reduce the cost per gigabyte nonvolatile memories, these devices have become denser by packing more data in the same silicon area, by scaling the size of the flash cells, adding three dimensional arrays of storage cells, and storing more bits in each of them. However, the changes in cell-size and storage cell configuration have come at the cost of impaired read back reliability. As read recovery retries increase, performance can be adversely impacted and system performance degraded.

Thus, a need still remains for a storage system with predictive adjustment mechanism to provide improved data reliability and minimize read access times. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an apparatus, including a control processor, configured to: read user data with a read threshold, determine which threshold adjustment range has been activated by reading a 1 and 0 counter, select an adjusted read threshold, based on the threshold adjustment range, to reread the user data in a physical block using the adjusted read threshold to correct the user data; and read the user data in the physical block using the adjusted read threshold selected from the threshold adjustment range.

An embodiment of the present invention provides a method including reading user data from a non-volatile memory array using a read threshold; determining which threshold adjustment range has been activated by reading a 1 and 0 counter; selecting an adjusted read threshold, based on the threshold adjustment range, including rereading the user data in a physical block using the adjusted read threshold to correct the user data; and reading the user data in the physical block using the adjusted read threshold selected from the threshold adjustment range.

An embodiment of the present invention provides a non-transitory computer readable medium including instructions for execution including: reading user data from a non-volatile memory array using a read threshold; determining which threshold adjustment range has been activated by reading a 1 and 0 counter; selecting an adjusted read threshold, based on the threshold adjustment range, including rereading the user data in a physical block using the adjusted read threshold to correct the user data; and reading the user data in the physical block using the adjusted read threshold selected from the threshold adjustment range.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 3 is a graphical view of an exemplary distribution of threshold voltages applied to a cell in the non-volatile memory array.

DETAILED DESCRIPTION

Figure 1:
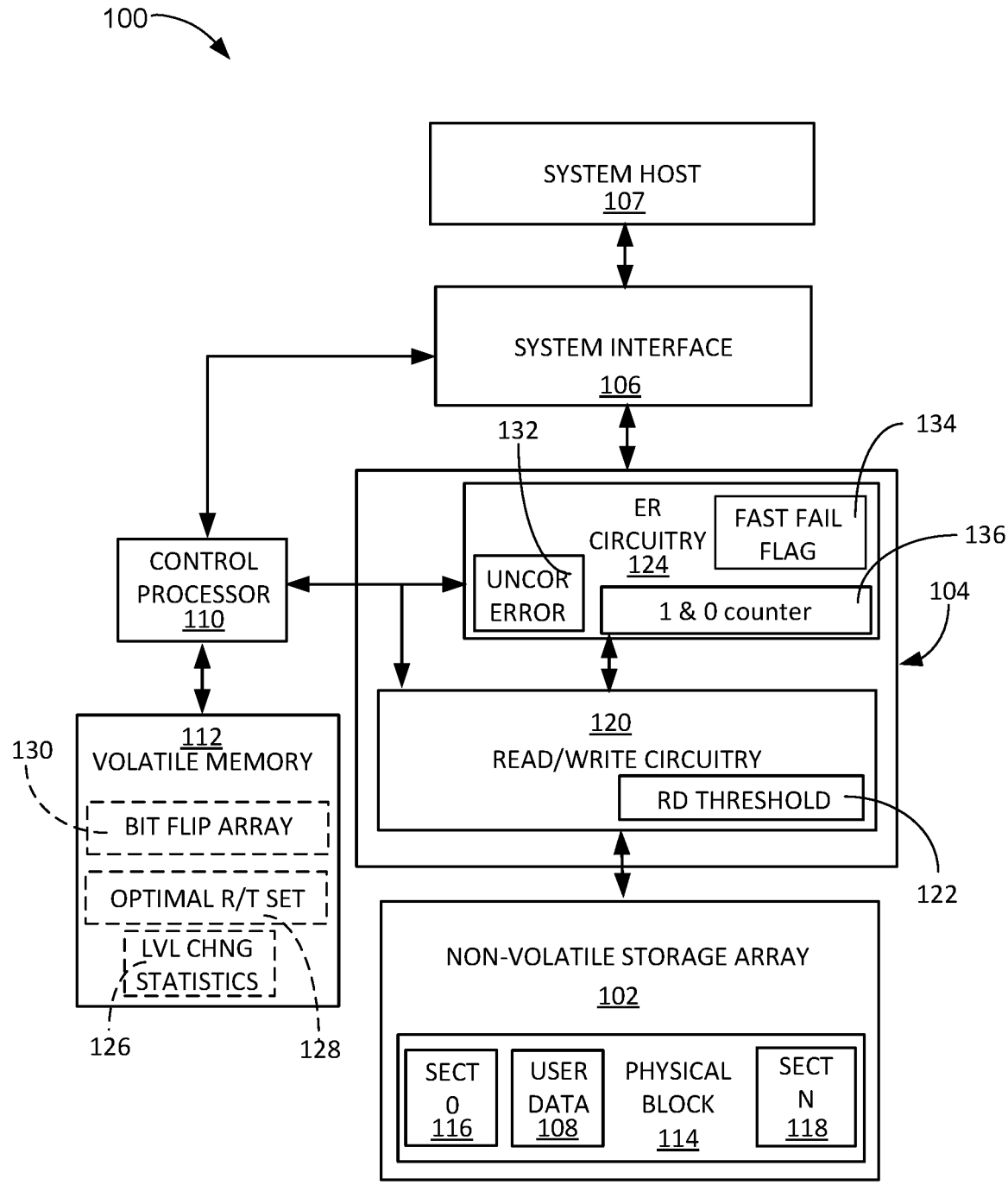
FIG. 1 is a block diagram of a storage system with predictive adjustment mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

The term "module" referred to herein can include hardware or hardware supported by software in an embodiment of the present invention in accordance with the context in which the term is used. For example, the software can be machine code, firmware, embedded code, and application software. Also, for example, the hardware can be circuitry, processor, computer, integrated circuit, integrated circuit cores, application specific integrated circuit (ASIC), passive devices, or a combination thereof.

As an example, one method to reduce the time spent in error recovery is to apply a read threshold mechanism to predict the optimum read threshold of a storage page and adjust it for the usable storage before the errors become unrecoverable. The term "predictive adjustment" referred to herein can include proactively making adjustments to the read channel in order to increase the probability of reading the user data correctly on the next attempt. The term "plane" referred to herein can be defined as an integrated circuit memory device or a separately regulated portion of the integrated circuit memory device that can have multiple of the separately regulated portion.

Referring now to FIG. 1, therein is shown a functional block diagram of a storage system 100 with error mitigation mechanism in an embodiment of the present invention. The functional block diagram of the storage system 100 depicts a non-volatile memory array 102 coupled to a read/write channel 104. A system interface 106 transfers user data 108 to and from the non-volatile memory array 102. The system interface 106 can execute the movement of the user data 108 into and out of the storage system 100. As an example, the system interface 106 can transfer the user data 108 through the read/write channel 104 for storage to and retrieval from the non-volatile memory array 102.

The non-volatile memory array 102 can include multiple integrated circuit die, multiple planes within the multiple integrated circuit die, or a combination thereof, for the purpose of storing and accessing the user data 108 provided through the system interface 106. The non-volatile memory array 102 can include any number of non-volatile memory integrated circuits capable of storing multiple bits per cell, such as multi-level cell (MLC), triple-level cell (TLC), quad-level cell (QLC), or a combination thereof. The system interface 106 can communicate with a system host 107 through one or more interface protocols, such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The read/write channel 104 can be a hardware structure that can be supported by software, to encode and decode the user data 108 for storage in the non-volatile memory array 102. The read/write channel 104 can also generate error correction data and perform error correction of the user data 108 read from the non-volatile memory array 102. The user data 108 can be program data or input data stored in the non-volatile memory array 102 for later execution or processing.

A control processor 110 can provide at least a portion of the computation resource for the storage system 100. For example, the control processor 110 can be a processor, an application specific integrated circuit (ASIC), an embedded processor, a microprocessor, a hardware control logic, a hardware finite state machine (FSM), a digital signal processor (DSP), or a combination thereof. The control processor 110 can coordinate the operation of the storage system 100. As an example, the control processor 110 can be coupled to the system interface 106, the read/write channel 104, and a volatile memory 112.

The volatile memory 112 provides at least a portion of the storage of information for the storage system 100. As examples, the volatile memory 112 can be a volatile memory array, such as a matrix of interconnected volatile memory integrated circuits including dynamic random access memory (DRAM), static random access memory (SRAM), register files, non-volatile memory, or a combination thereof, coupled to the control processor 110.

The system interface 106 can be supported by the control processor 110. The control processor 110 can be implemented with hardware circuitry in a number of different manners. The system interface 106 can be implemented as a hardware control logic, a hardware finite state machine (FSM), or a programmable bus controller, that can provide data transport between the non-volatile memory array 102 and the system host 107.

The system host 107 can be a computer, a processor, a processor core, a device controller, or a combination thereof configured to generate, store, and retrieve the user data 108. The host system 107 can be directly coupled to the system interface 106, or it can be attached through a local bus, a local area network (LAN), or wide area network (WAN).

The non-volatile memory array 102 can also include a remote resource, such as a NAND flash-based network attached storage (NAS), storage area network (SAN), or a combination thereof. The cells in the non-volatile memory array 102 are organized into a plurality of super blocks 114. Each of the super blocks 114 can contain data pages from sector 0 116 through sector N 118, with each of the sector 0 116 through the sector N 118 written on a separate integrated memory device or a plane in the integrated memory device. Where the page can be a read/write unit page, a physical page, a word line, or a physical block within an integrated memory device or a plane within the integrated memory device.

A read/write circuitry 120 can manage the writing to the sector 0 116 through sector N 118. During the reading of the user data 108, the read/write circuitry 120 can manipulate a read threshold 122 in order to adjust for errors detected by an error recovery (ER) circuitry 124. The control processor 110 can collect a count of the read data level changes as the read threshold 122 is changed. The control processor 110 can maintain the count of level change statistics 126 indicating that a bit flip in the user data 108 caused by a level change has occurred on any of the read thresholds 122, which can be stored in the volatile memory 112.

The control processor 110 can adjust the read threshold 122, of the sector 0 116 through sector N 118, based on the read threshold mechanism of the level change statistics 126, such as the bit flip count or information indicating a change in the data level between adjacent values of the read threshold 122, in order to maintain the operational performance of the currently addressed sector in the physical block 114.

The control processor 110 can manage the operation of the read/write channel 104 including performing calculations, optimizing the read threshold 122, and execution of interface commands delivered from the host system 107. The control processor 110 can provide the level change statistics 126 when reading the user data 108. The ER circuitry 124 can be a hardware structure used to encode intended or targeted data for providing error protection, error detection, error correction, redundancy, or a combination thereof.

The ER circuitry 124 can include a 1 and 0 counter 136. The 1 and 0 counter 136 can be a hardware structure that can monitor the state of the individual data bits of the selected one of the sector 0 116 through sector N 118 while processing the read data. During the analysis of the read threshold 122, the control processor 110 can read the user data 108, without enabling the ER circuitry 124 to perform error correction on the data, in order to capture each instance of a level change in the user data 108. The control processor 110 can also read the output of the 1 and 0 counter 136 to determine whether the last read attempt provided a balanced number of 1's and 0's in the data pattern or a range of offset exists in the difference between the number of 1's and 0's.

The read threshold 122 is defined as a selectable voltage reference used when reading the stored value in the sector 0 116 through sector N 118. The read threshold 122 can provide the voltage reference in incremental steps. By way of an example, the read threshold 122 can have 128 linear steps that set the reference voltage for each of the design point voltage levels for the ideal read-back cell. The TLC NAND will have 7 major bit thresholds, {A, B, C, D, E, F, G}. The 128 steps available can be centered on each of the 7 major thresholds. This can be compared to QLC NAND, which has 15 major thresholds, and 128 steps applied to each.

As an example, the read of any of the sector 0 116 through sector N 118 using each of the possible settings of the read threshold 122, can subject the selected one of the sector 0 116 through sector N 118 to hundreds or thousands of read operations and bring the performance of the storage system 100 to a halt. The full analysis of the read threshold 122 can further damage an already impaired version of the sector 0 116 through sector N 118 due to the reads depleting the charge of the stored data. This situation can be compensated for by maintaining an optimal value of the read threshold 122 for the physical page or plane in the physical block 114.

The storage system 100 can generate an optimal read threshold set 128 by performing multiple reads of the user data 108 with stepped values of the read threshold 122. Between reads, the read threshold 122 can be incremented and the resulting data compared. By detecting and logging the number of bits that change value on each incremental step, a bit flip array 130 can be constructed. The bit flip array can be a matrix of the number of level changes counted for each selected offset step count for each of the read threshold 122 {A, B, C, D, E, F, G}. The control processor 110 can search the bit flip array 130 for the threshold step that represents the minimum number of changed bits for each of the read threshold 122 {A, B, C, D, E, F, G}. These threshold steps can represent the optimal read threshold set 128, which can provide the higher probability of correctly reading the user data 108 without detecting an uncorrectable error 132. The uncorrectable error 132 is a data error that contains too many bit errors for the ER circuitry 124 to correct the user data 108 without additional read processing.

A large number of program and erase (P/E) cycles can cause the voltage of the cells holding the user data 108 to deviate from expected ranges after programming. Read disturbs, which refers to a significant amount of read operation on the sector 0 116 through sector N 118 of the physical block 114, also causes the physical block 114 to shift to a higher voltage range. Therefore, it is highly beneficial to calculate the optimal read threshold set 128, which provide the smallest number of read errors.

As the sector 0 116 through sector N 118 are repeatedly accessed, the voltage level of the user data 108 can shift making the valid settings for the read threshold 122 change over time. The read threshold 122 can be adjusted, each time a successful read has occurred, based on the level change statistics 126 detected by the ER circuitry 124. The detection of the uncorrectable error 132 can cause the bit flip array 130 to be re-initialized and selection of a new set of the optimal read threshold set 128 in order to read the non-volatile memory array 102 without errors. In order to alleviate the additional number of reads required to correct the data read from and of the sector 0 116 through sector N 118, the control processor 110 can monitor the 1 and 0 counter to determine whether there is a balance in the data pattern.

The control processor 110 can be configured to manage a fast fail flag 134 in order to minimize the time spent attempting to correct the uncorrectable error 132. The fast fail flag 134 can be a register bit used to signal the ER circuitry 124 to terminate the processing of the uncorrectable error 132 when it is detected, without performing rereads with different values of the read threshold 122. The fast fail flag 134 can prevent a lengthy error recovery process and turn the error processing over to the system host 107 to regenerate the user data 108 by other means.

For illustrative purposes, the storage system 100 is described as utilizing the error correction mechanism in storing and accessing information with NAND flash memory. The NAND Flash memory can include single-level cell (SLC), multi-level cell (MLC), triple-level cell (TLC), quad-level cell (QLC), or the like. Although, it is understood that the storage system 100 can utilize the error correction mechanism with other types of memory, such as resistive non-volatile memory, other types of flash or non-volatile memory, or a combination thereof.

It is understood that the embodiment discussed above is used to describe one embodiment and other embodiments are possible. Another possible embodiment can integrate the control processor 110, the read/write channel 104, the system interface 106, the non-volatile memory array 102, or a combination thereof into a single circuit.

It has been discovered that the control processor 110 can proactively map the optimal read threshold set 128 for the sector 0 116 through sector N 118 in the physical block 114 in order to read any additional of the sector 0 116 through sector N 118 without errors. This can allow the ER circuitry 124 to calculate the level change statistics 126 for further monitoring the read reliability of the sector 0 116 through sector N 118 and make predictive adjustments to the read threshold 122 for reading the rest of the user data 108 stored in the physical block 114. By way of an example, the 1 and 0 counter 136 can provide guidance to the direction and magnitude of the change in the read threshold 122 required to correctly read the user data 108 stored in the sector 0 116 through sector N 118 in the physical block 114. By proactively updating the optimal read threshold set 128, the remaining portion of the user data 108 can be read from the physical block 114 without errors.

Figure 2:
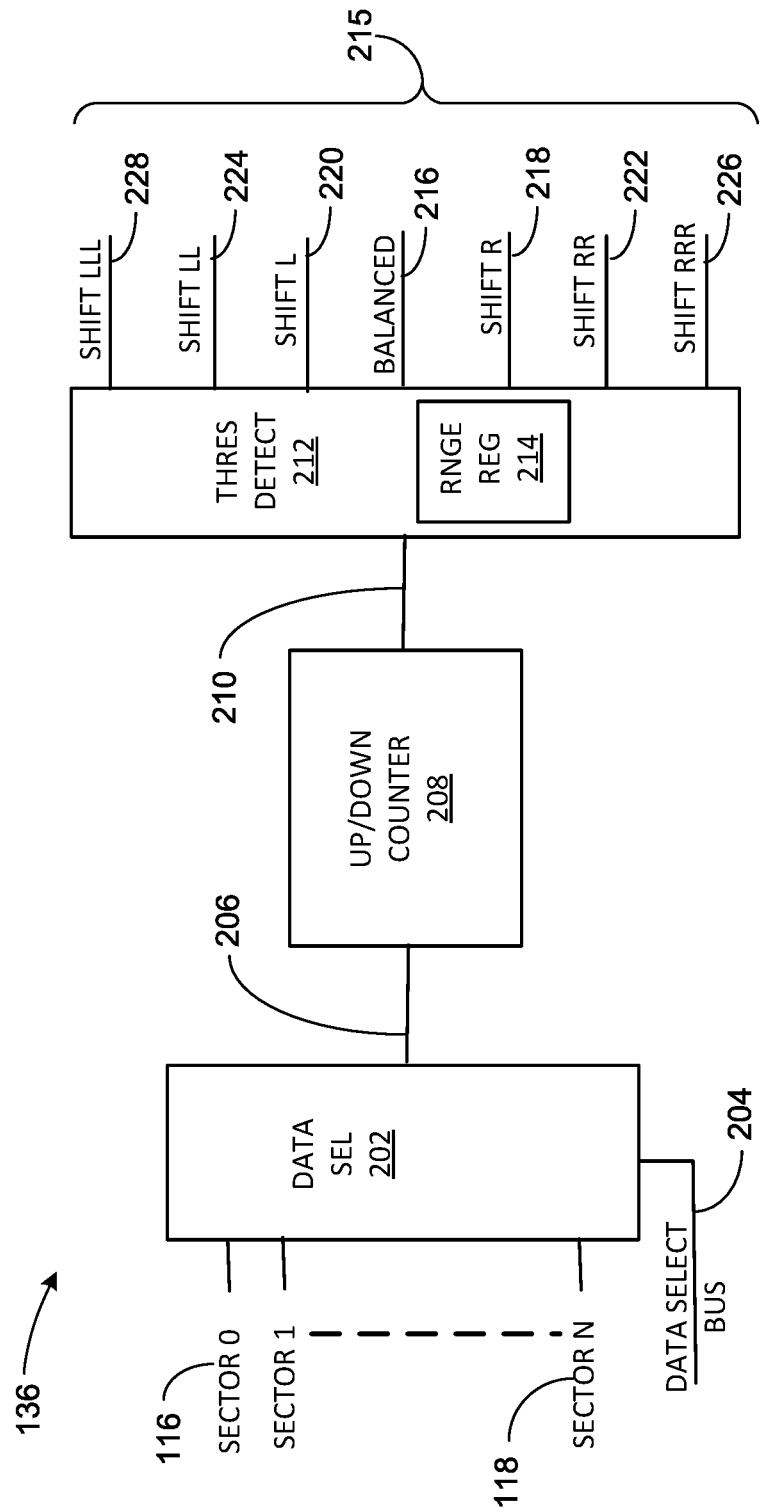
FIG. 2 depicts a functional block diagram of a 1 and 0 counter in an embodiment.

Referring now to FIG. 2, therein is a functional block diagram of the 1 and 0 counter 136 in an embodiment. In this example, the functional block diagram of the 1 and 0 counter 136 depicts the sector 0 116 through sector N 118 coupled to a data selector 202. The data selector 202 can be a hardware multiplexer controlled by the control processor 110 of FIG. 1 through a data select bus 204. The data selector 202 can pass the user data 108 of FIG. 1 present on the input coupled to the sector 0 116 through sector N 118 based on the address of the data select bus 204.

A selected channel data 206, output from the data selector 202, can be input to an up/down counter 208. The up/down counter 208 can be a hardware structure that can increment or decrement based on a data bit detected as a 0 or 1 respectively. In this example, a correctly read one of the sector 0 116 through sector N 118 would result in the counter ending at a count of zero because there are the same number of 1's and 0's in the selected channel data 206. When the selected channel data 206 does not contain the same number of 1's and 0's, the up/down counter 208 can indicate a residual count 210 that is not equal to zero.

In this example, the detection of the uncorrectable error 132 of FIG. 1 indicates that there are more error bits in the selected one of the sector 0 116 through sector N 118 than can be corrected by the ER circuitry 124 of FIG. 1 performing error correction of the selected channel data 206 without additional information. During the error recovery process, the control processor 110 of FIG. 1 can adjust the read threshold 122 of FIG. 1 in order to increase the possibility of correcting the user data 108 presented on the selected channel data 206. In some examples, the adjustment of the read threshold 122 will not improve the likelihood of correcting the user data 108 presented on the selected channel data 206. In this example, other means can be employed to correct the user data 108.

The residual count 210 can be an indication that the read threshold 122 used to access the user data 108 might have produced an offset in the number of 1's and 0's in the sector being read. The residual count 210 can be coupled to a threshold detector 212 that can categorize the difference between the number of 1's and 0's in the user data 108. When the residual count 210, representing the difference in the count of 0's and the count of 1's, is compared in a range register 214, to provide an indication of an adjustment that can be made to the optimal read threshold set 128 of FIG. 1 and the read threshold 122 in order to mitigate errors in the sector 0 116 through sector N 118 within the physical block 114.

The residual count 210 can be an indicator of the type of adjustment required to correctly read the physical block 114. The residual count 210 can be compared to the value contained in the range register 214. The threshold detector 212 can identify threshold adjustment ranges 215 that can enable the update of the read threshold 122. The range register 214 can include upper and lower limits for each of the threshold adjustment ranges 215. The threshold adjustment ranges 215 can be configured by the control processor 110 to establish an appropriate response for adjusting the read threshold 122 based on the difference in the 1's and the 0's count represented by the residual count 210. The threshold adjustment ranges 215 can include a sector balanced 216, a shift R 218, a shift L 220, a shift RR 222, a shift LL 224, a shift RRR 226, and a shift LLL 228.

Each of the threshold adjustment ranges 215 can represent a range of the residual count 210 indicating how much of a difference between the number of the 1's and the 0's was detected when the ER circuitry 124 was able to correct the uncorrectable error 132. The sector balanced 216 can indicate that there were a range between 20, representing 20 more 0's than the number of 1's, and −20, representing 20 more 1's than the number of 0's. Since the ER circuitry 124 is capable of correcting on the order to 256 error bits, the sector balanced 216 does not require an adjustment to the read threshold 122, but the value of the read threshold 122 used to correct the uncorrectable error 132 can be transferred to the optimal read threshold set 128.

The shift R 218 can indicate a count of −21 to −40, more 1's than 0's, which allows the read threshold 122 to be adjusted by one count to the right, as an increase in the read threshold 122, prior to updating the optimal read threshold set 128. The shift L 220 can indicate the count of 21 to 40, more 0's than 1's, which allows the read threshold 122 to be adjusted by one count to the left, as a decrease in the read threshold 122, prior to updating the optimal read threshold set 128. It is understood that shifting the read threshold 122 by one count can include a number N of the 128 individual adjustment steps of the read threshold 122.

The shift RR 222 can indicate a count of −41 to −60, more 1's than 0's, which allows the read threshold 122 to be adjusted by two counts to the right, as an increase in the read threshold 122, prior to updating the optimal read threshold set 128. The shift LL 224 can indicate the count of 41 to 60, more 0's than 1's, which allows the read threshold 122 to be adjusted by two count to the left, as a decrease in the read threshold 122, prior to updating the optimal read threshold set 128.

The shift RRR 226 can indicate a count less than or equal to −61, more 1's than 0's, which allows the read threshold 122 to be adjusted by three counts to the right, as an increase in the read threshold 122, prior to updating the optimal read threshold set 128. The shift LLL 228 can indicate the count greater than or equal to 61, more 0's than 1's, which allows the read threshold 122 to be adjusted by three count to the left, as a decrease in the read threshold 122, prior to updating the optimal read threshold set 128.

The ability to adjust the read threshold 122 prior to updating the optimal read threshold set 128 can proactively mitigate errors that would have otherwise been detected by reads of the sector 0 116 through the sector N 118 within the physical block 114. When the adjustment of the read threshold 122, based on the threshold adjustment ranges 215, can circumvent the error recovery processes in the rest of the physical block 114. The ability to read the rest of the physical block 114 without going through the error recovery process can significantly increase the performance of the storage system 100 of FIG. 1.

It has been discovered that the application of the 1 and 0 counter 136 can help predict the proper setting of the read threshold 122 in order to reduce errors in the sector 0 116 through the sector N 118 of the physical block 114, while extending the useable life of the non-volatile memory array 102 of FIG. 1. The error recovery process can reduce the number of the read retries that are applied to the remainder of the sector 0 116 through the sector N 118 that would have been detected as the uncorrectable error 132. The resulting adjustments to the read threshold 122 that is updated to the optimal read threshold set 128 can improve the performance of the system host 107 of FIG. 1. The control processor 110 can update the adjustments to the read threshold 122 after any error, correctable or uncorrectable, in the user data 108. The update of the optimal read threshold set 128 allows a more accurate tracking of changes in the physical block 114 to provide the highest probability of reading the user data 108 without detecting the uncorrectable error 132.

Referring now to FIG. 3, therein is shown a graphical view of an exemplary distribution of threshold voltages applied to a cell 301 in the non-volatile memory array. The graphical view of the exemplary distribution of threshold voltages depicts an initial threshold 302 positioned between a one 304 and a zero 306. The initial threshold 302 can be positioned anywhere between the one 304 and the zero 306. As an example, the initial threshold 302 can be positioned differently due to the wearing of the cell and the longevity of the user data 108 of FIG. 1 stored in the cell.

By way of an example, the initial threshold 302 is shown centered between the 1's 304 and the 0's 306, but the actual position of the initial threshold 302 can move based on the current state of the user data 108 stored in the cell 301. As the cell 301 is read and the user data 108 ages, the initial threshold 302 can be shifted and stored in the optimal threshold set 128 of FIG. 1. A first right shifted threshold 308 can be shifted to the right by a count 309, which in this example can be eight of the 128 threshold steps available around the initial threshold 302. A second right shifted threshold 310 can be shifted right by two counts from the initial threshold 302. As the life of the cell 301 advances, the profile of the 1's 304 and the 0's 306 can shift causing the optimal value of the read threshold 122 of FIG. 1 to shift as well. In order to track the changing profile of the user data 108 the optimal read threshold set 128 and the size of the count 309 can be updated with each successful read of the cell 301.

A first left shifted threshold 312 can be shifted to the left by the count 309, which in this example can be eight of the 128 threshold steps available around the initial threshold 302. A second left shifted threshold 314 can be shifted left by two counts from the initial threshold 302. As the cell 301 wears, the control processor 110 can increase or decrease the size of the count 309 to satisfy the recovery of the user data 108 stored in the cell 301. By way of an example, there can be additional versions of shifted thresholds 316, such as the shift RRR 226 of FIG. 2 and the shift LLL 228 of FIG. 2.

The control processor 110 can establish the number and spacing of the shifted thresholds 316 in order to manage the recovery time spent on the error recovery of the user data 108. It will be understood that as the user data 108 ages the size of the count could increase in order to minimize the time used for recovery of the user data 108. By way of an example, the control processor 110 can increase the number of the shifted thresholds 316, increase the size of the count 309, or a combination thereof to minimize the time required for error correction of the user data 108.

The control processor 110 can select a starting value and the order of application of the shifted thresholds 316 by reading the threshold adjustment ranges 215 from the 1 and 0 counter 136 of FIG. 1. By way of an example, if the shift RR 222 of FIG. 2 is activated that indicates a larger change in the read threshold 122 would be required to correctly read the user data 108. In this case the second right shifted threshold 310 can be the first of the adjusted thresholds 316 to be attempted for a reread of the user data 108. By using the range information provided by the 1 and 0 counter 136, the read recovery can be more efficient because the one of the shifted thresholds 316 that has the best probability of success is used first.

It has been discovered that the management of the shifted thresholds 316 can provide improved performance when data recovery of the user data 108 must be performed by applying the shifted thresholds 316 that best matches the threshold adjustment ranges 215 that are activated. The use of the count 309 can make the selection of the next attempted one of the read threshold 122 more accurate because the control processor 110 can update the position of the initial threshold 302 and the size of the count 309 after every successful read or recovery of the user data 108.

Figure 4:
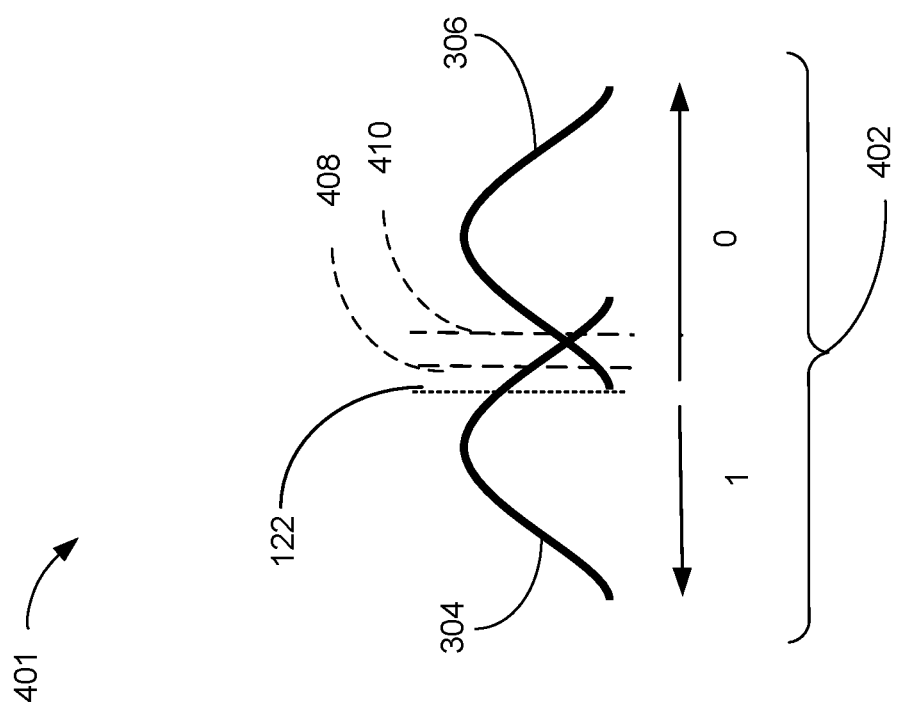
FIG. 4 is a graphical view of an exemplary access of a cell of a non-volatile memory.

Referring now to FIG. 4, therein is shown a graphical view of an exemplary access 401 of a cell of the non-volatile memory array 102. The graphical view of the exemplary access 401 of the cell of the non-volatile memory array 102 depicts a corrected data error 402 as read from the cell in the physical block 114 of FIG. 1. The read threshold 122 can be set by the control processor 110 of FIG. 1 based on the age and condition of the non-volatile memory array 102 of FIG. 1. The corrected data error 402 can have the read threshold 122 shifted from the optimal value. In the present embodiment, the value of the read threshold 122 can be adjusted to a more advantageous position before the read threshold 122 is added to the optimal read threshold set 128. The adjusting of the read threshold 122 based on the threshold adjustment ranges 215 can proactively mitigate the errors that would have been detected while reading the user data 108 from the physical block 114.

In the exemplary access 401 of a cell of the non-volatile memory array 102, the control processor 110 can sample the threshold adjustment ranges 215 in order to determine what amount of adjustment should be applied to the further accesses of the physical block 114. Since the read threshold 122 is skewed to the left during processing of the corrected error 402, the control processor 110 can find the shift RR 222 of FIG. 2 activated based on the difference in count of 1's 304 and 0's 306. By adjusting the read threshold 122 to a position to the right a first adjusted threshold 408 can represent the position indicated by the shift R 218 of FIG. 2 and the control processor 110 can determine that a second adjusted threshold 410 can represent the position indicated by the shift RR 222 of FIG. 2. The second adjusted threshold 410 can be correctly positioned for further reads of the user data 108 from the physical block 114. This can be verified by a reread of the user data 108 and checking the sector balanced 216 of FIG. 2 to verify the balance of the 1's 304 and the 0's 306.

It has been discovered that the control processor 110 can sample the threshold adjustment ranges 215 in order to mitigate errors in the physical block 114. By selecting the first adjusted threshold 408 or the second adjusted threshold 410 before updating the optimal read threshold set 128, the user data 108 can be read from the physical block 114 with few or none of the corrected error 402 or the uncorrectable error 132 detected because the threshold has been adjusted to the optimal value for the rest of the physical block 114. It is understood that additional selections of the read threshold 122 can be preset by the control processor 110 based on the age and use of the cell of the non-volatile memory array 102. Over the life of the non-volatile memory array 102, the control processor 110 can update the amount of adjustment applied to the read threshold 122 for each of the count associated with the current condition of the non-volatile memory array 102. It is understood that each of the count used to position the first adjusted threshold 408 or the second adjusted threshold 410 can represent one or more of the 128 threshold steps associated with the read threshold 122.

Figure 5:
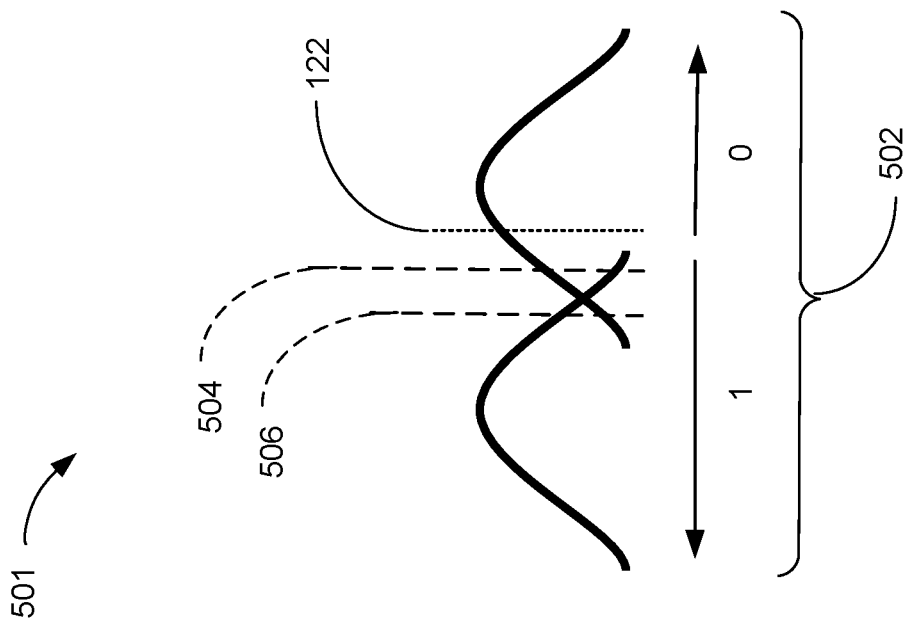
FIG. 5 is a graphical view of an exemplary access of a cell of the non-volatile storage array.

Referring now to FIG. 5, therein is shown a graphical view of an exemplary access 501 of a cell of the non-volatile memory array 102. The graphical view of the exemplary access 501 of the cell of the non-volatile memory array 102 depicts a corrected data error 502 as read from the cell in the physical block 114 of FIG. 1. The read threshold 122 can be set by the control processor 110 of FIG. 1 based on the age and condition of the non-volatile memory array 102 of FIG. 1. The corrected data error 502 can have the read threshold 122 shifted from the optimal value. In the present embodiment, the value of the read threshold 122 can be adjusted to a more advantageous position before the read threshold 122 is added to the optimal read threshold set 128. The adjusting of the read threshold 122 based on the threshold adjustment ranges 215 can proactively mitigate the errors that would have been detected while reading the user data 108 from the physical block 114.

In the exemplary access 501 of a cell of the non-volatile memory array 102, the control processor 110 can sample the threshold adjustment ranges 215 in order to determine what amount of adjustment should be applied to the further accesses of the physical block 114. Since the read threshold 122 is skewed to the right during processing of the corrected error 502, the control processor 110 can find the shift LL 224 of FIG. 2 activated based on the difference in count of the 1's 304 of FIG. 3 and the 0's 306 of FIG. 3. By adjusting the read threshold 122 to a position two counts to the left a first adjusted threshold 504 or the second adjusted threshold 506 can be correctly positioned for further reads of the user data 108 from the physical block 114. It is understood that the control processor 110 can provide adjust the interval of adjustment counts for each of the threshold adjustment ranges 215.

It has been discovered that the control processor 110 can sample the threshold adjustment ranges 215 in order to mitigate errors in the physical block 114. By calculating the first adjusted threshold 504 and the second adjusted threshold 506 before updating the optimal read threshold set 128, the user data 108 can be read from the physical block 114 with few or none of the corrected error 502 or the uncorrectable error 132 detected because the threshold has been adjusted to the optimal value for the rest of the physical block 114.

Figure 6:
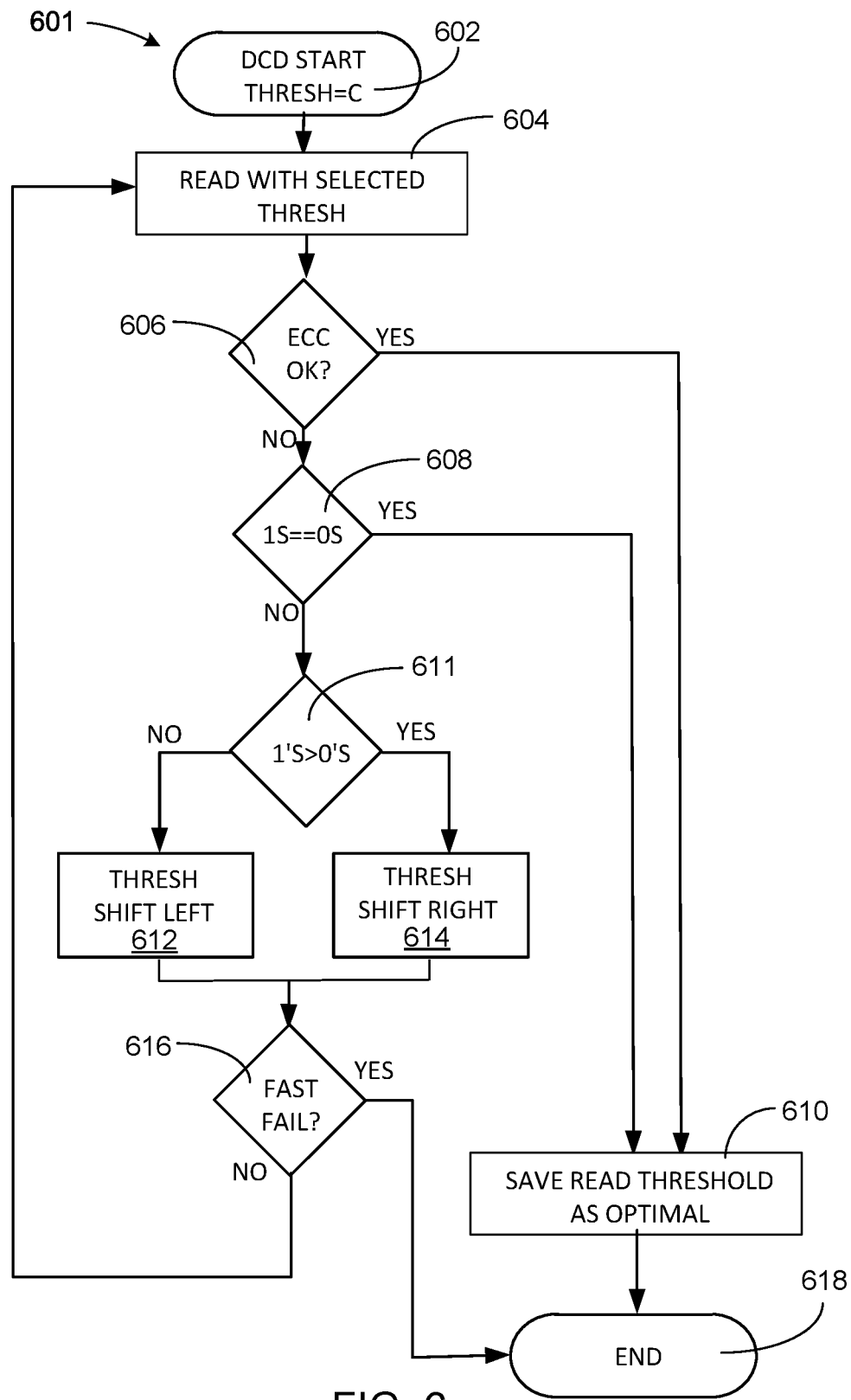
FIG. 6 is an operational flow diagram of the storage system with predictive adjustment mechanism in an embodiment of the present invention.

Referring now to FIG. 6, therein is shown an operational flow diagram 601 of the storage system 100 with predictive adjustment mechanism in an embodiment of the present invention. It is understood that the functions described in this application can be implemented as instructions stored on a non-transitory computer readable medium to be executed by a host processor (not shown), the control processor 110 of FIG. 1, such as a math co-processor, a processor core, or a combination thereof.

The non-transitory computer readable medium can include compact disk (CD), digital video disk (DVD), or universal serial bus (USB) flash memory devices. The non-transitory computer readable medium can be integrated as a part of a host system not shown or installed as non-volatile memory array 102 of the storage system 100.

The non-transitory computer readable medium can include instructions required to perform the operations of a decode start with initial threshold 602. The first selection of the read threshold 122 of FIG. 1 can be the initial threshold 302 of FIG. 3. The user data 108 of FIG. 1 read with the initial value of the read threshold 122 can be a baseline for further analysis.

The flow can include a read user data with a read with selected threshold 604, in which the control processor 110 of FIG. 1 can configure the read/write circuitry 120 of FIG. 1 to access the user data 108 using the current selected value of the read threshold 122.

The flow includes a check for ECC OK 606, the control processor 110 can monitor the occurrence of any of the correctable error 402 of FIG. 4 or the uncorrectable error 132 of FIG. 1 in the user data 108. If the user data 108 was ECC correctable, the flow then proceeds to a save read threshold as optimal 610 to save the adjusted threshold 504 of FIG. 5 in the optimal read threshold set 128. The control processor 110 can configure the error recovery circuitry 124 of FIG. 1 to correct any of the correctable errors 402 on-the-fly with no further reading of the user data 108.

If the ECC OK 606 is not satisfied, the flow proceeds to a check for sector balanced 608 where the control processor 110 can access the 1 and 0 counter 136 of FIG. 1 to determine whether the user data 108 has a disparity in the number of 1's and 0's in the sector. It is understood that the user data 108 has been written with an equal number of the 1's 304 of FIG. 3 and the 0's 306 of FIG. 3. As the cells of the physical block 114 age, some of the data in the cells can shift and be mis-read. The control processor 110 can load the range register 214 in the 1 and 0 counter 136 that can activate the detection of the threshold adjustment ranges 215 of FIG. 2. If the sector balanced 216 is active, the number of 1's 304 and 0's 306 is within the range established by the control processor 110 loading the range register 214. When the sector balanced 216 is activated, the flow can proceed to the save read threshold as optimal 610 without making any further adjustments to the read threshold 122. The save read threshold as optimal 610 can save the adjusted threshold 504 of FIG. 5 in the optimal read threshold set 128. The sector balanced 216 indicates that the read threshold 122 is appropriate for further reading of the user data 108.

If the check for sector balanced 608 determines that the number of the 1's 304 and the 0's 306 is not balanced, the control processor 110 can determine which of the threshold adjustment ranges 215 is activated. The flow proceeds to a check for a number of 1's greater than the number of 0's 611. If the number of 1's 304 is not greater than the number of 0's 306, as indicated by the shift L 220 of FIG. 2, the shift LL 224 of FIG. 2, or the shift LLL 228 of FIG. 2 being active, the flow proceeds to a threshold shift left 612. The control processor 110 can adjust the read threshold 122 by an appropriate count to satisfy the threshold adjustment ranges 215 based on the age of the data and condition of the cells of the non-volatile memory array 102.

If the check for number of 1's greater than the number of 0's 611 determines that the number of 1's is greater than the number of 0's, as indicated by the shift R 218 of FIG. 2, the shift RR 222 of FIG. 2, or the shift RRR 226 of FIG. 2 being active, the flow proceeds to a threshold shift right 614. The control processor 110 can adjust the read threshold 122 based on the magnitude indicated by the threshold adjustment ranges 215.

The flow can proceed from the threshold shift left 612 or the threshold shift right 614 to a check for fast fail 616, in which the control processor 110 can determine whether the storage system 100 of FIG. 1 is configured to fail at the first detection of the uncorrectable error 132 of FIG. 1 or has attempted all of the possible steps of the read threshold 122. If the control processor 110 determines that the fast fail flag is set, the flow proceeds directly to an end 618 to conclude the processing of the user data 108 by reporting the uncorrectable error 132 to the system host 107 of FIG. 1, for activating alternative recovery processes within the system host 107. The control processor 110 can monitor the adjusted threshold 504 that has been attempted on the user data 108, in order to identify when all the thresholds have been attempted. If the full range of the adjusted threshold 504 has been attempted, the flow can proceed to the end 618 to conclude the processing of the user data 108 by reporting the uncorrectable error 132 to the system host 107.

If the control processor 110 determines that the check for fast fail 616 is not activated, the flow can return to the read with selected threshold 604 to continue processing of the user data 108. The control processor 110 can monitor the adjusted threshold 504 that has been attempted on the user data 108, in order to identify when all the thresholds have been attempted. At any time the user data 108 can be corrected, as identified by the ECC OK 606, or is within a correctable range, as identified by the check for sector balanced 608, the control processor can proceed to the save read threshold as optimal 610 and then proceed to the end 618.

It has been discovered that the storage system 100 can increase performance of the non-volatile memory array 102 when accessing the user data 108. The updating of the optimal read threshold set 128, based on the threshold adjustment ranges 215, can minimize the likelihood of detecting the uncorrectable error 132 when reading the sector 0 116 through the sector N 118 of the physical block 114. Each of the physical block 114 in the non-volatile memory array 102 can have a different set of values for the optimal read threshold set 128. When the optimal read threshold set 128 activates the sector balanced 216 or correctly read the user data 108, the processing can be complete and the data recovered through the last used of the read threshold 122. While the user data 108 being read is corrected using the read threshold 122, the control processor 110 can perform adjustments to generate the adjusted read threshold 408 of FIG. 4 based on the threshold adjustment ranges 215 prior to updating the optimal read threshold set 128. This process can significantly reduce the likelihood of detecting the uncorrectable error 132 while reading the remainder of the user data 108 in the physical block 114.

Figure 7:
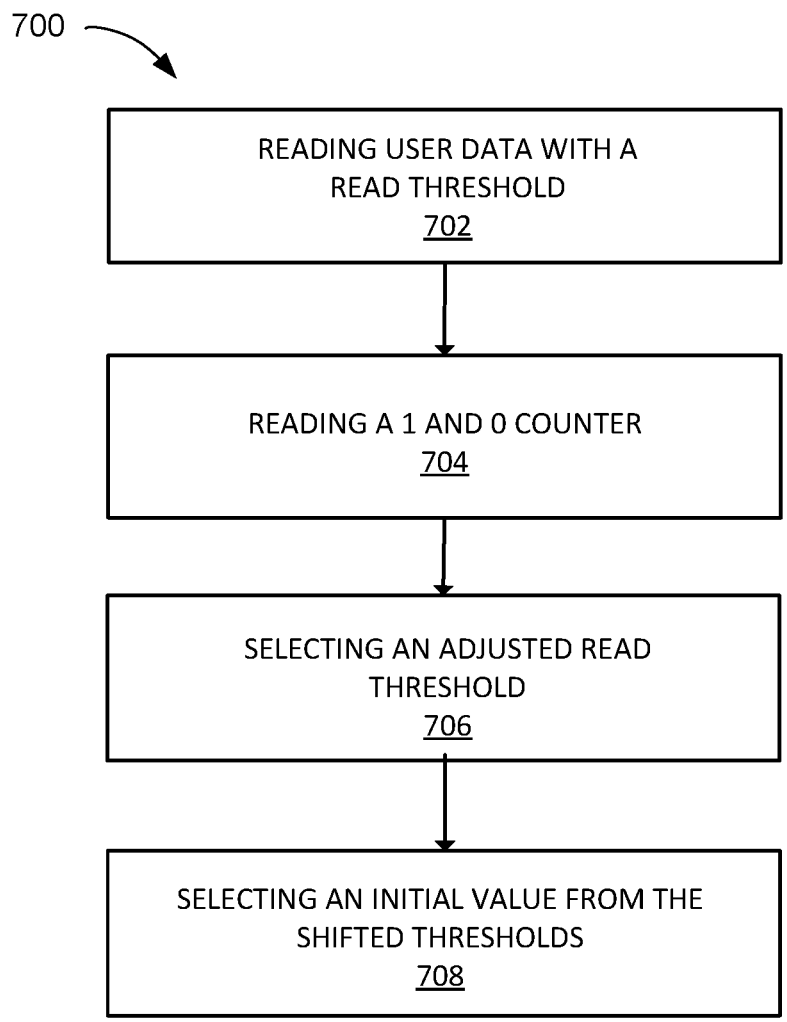
FIG. 7 is a flow chart of a method of operation of a storage system in an embodiment of the present invention.

Referring now to FIG. 7, therein is shown a flow chart of a method 700 of operation of a storage system 100 in an embodiment of the present invention. The method 700 includes: reading user data from a non-volatile memory array using a read threshold in a block 702; determining which threshold adjustment range has been activated by reading a 1 and 0 counter, in a block 704; selecting an adjusted read threshold, based on the threshold adjustment range, including rereading the user data in a physical block using the adjusted read threshold to correct the user data, in a block 706; and reading the user data in the physical block using the adjusted read threshold (308) selected from the threshold adjustment range, in a block 708.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level. While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A storage system comprising:
a control processor, configured to:
read user data with a read threshold,
determine which threshold adjustment range has been activated by reading a 1 and 0 counter,
select an adjusted read threshold, based on the threshold adjustment range, to reread the user data in a physical block using the adjusted read threshold to correct the user data includes a starting value of shifted thresholds for a reread of the user data based on the threshold adjustment range read from the 1 and 0 counter; and
read the user data in the physical block using the adjusted read threshold selected from the threshold adjustment range.

2. The system as claimed in claim 1 wherein the control processor is further configured to terminate a reread of the user data with an uncorrectable error when a check for fast fail is satisfied.

3. The system as claimed in claim 1 wherein the control processor is further configured to update an optimal read threshold set with the read threshold based on detecting an ECC OK or a sector balanced.

4. The system as claimed in claim 1 wherein the control processor is further configured to determine the adjusted read threshold by reading a shift L, a shift LL, and a shift LLL from the 1 and 0 counter, when a number of 0's is greater than a number of 1's.

5. The system as claimed in claim 1 wherein the control processor is further configured to determine the adjusted read threshold by reading a shift R, a shift RR, and a shift RRR from the 1 and 0 counter, when a number of 0's is less than a number of 1's.

6. The system as claimed in claim 1 wherein the control processor is, coupled to an error recovery (ER) circuitry, configured to terminate the reread of the user data with an uncorrectable error when a fast fail flag is activated.

7. A method of operation of a storage system comprising:
reading user data from a non-volatile memory array using a read threshold;
determining which threshold adjustment range has been activated by reading a 1 and 0 counter;
selecting an adjusted read threshold, based on the threshold adjustment range, including rereading the user data in a physical block using the adjusted read threshold to correct the user data including selecting an initial value of one of the shifted thresholds for the rereading of the user data based on the threshold adjustment range read from the 1 and 0 counter; and
reading the user data in the physical block using the adjusted read threshold selected from the threshold adjustment range.

8. The method as claimed in claim 7 further comprising terminating the rereading of the user data with an uncorrectable error when a check for fast fail is satisfied.

9. The method as claimed in claim 7 further comprising updating an optimal read threshold set with the read threshold when the control processor detects an ECC OK or a sector balanced.

10. The method as claimed in claim 7 further comprising determining the adjusted read threshold by reading a shift L, a shift LL, and a shift LLL, when a number of 0's is greater than a number of 1's.

11. The method as claimed in claim 7 further comprising determining the adjusted read threshold by reading a shift R, a shift RR, and a shift RRR, when a number of 0's is less than a number of 1's.

12. The method as claimed in claim 7 further comprising terminating the rereading of the user data with an uncorrectable error when a fast fail flag is activated in an error recovery (ER) circuitry.

13. A non-transitory computer readable medium including instructions for execution, the instructions comprising:
reading user data from a non-volatile memory array using a read threshold;
determining which threshold adjustment range has been activated by reading a 1 and 0 counter;
selecting an adjusted read threshold, based on the threshold adjustment range, including rereading the user data in a physical block using the adjusted read threshold to correct the user data including selecting an initial value of one of the shifted thresholds for the rereading of the user data based on the threshold adjustment range read from the 1 and 0 counter; and
reading the user data in the physical block using the adjusted read threshold selected from the threshold adjustment range.

14. The medium as claimed in claim 13 further comprising terminating the rereading of the user data with an uncorrectable error when a check for fast fail is satisfied.

15. The medium as claimed in claim 13 further comprising updating an optimal read threshold set with the read threshold when the control processor detects an ECC OK or a sector balanced.

16. The medium as claimed in claim 13 further comprising determining the adjusted read threshold by reading a shift L, a shift LL, and a shift LLL, when a number of 0's is greater than a number of 1's.

17. The medium as claimed in claim 13 further comprising determining the adjusted read threshold by reading a shift R, a shift RR, and a shift RRR, when a number of 0's is less than a number of 1's.

* * * * *